United States Patent
Lin et al.

(10) Patent No.: US 7,079,309 B1
(45) Date of Patent: Jul. 18, 2006

(54) USE OF A PHOTONIC CRYSTAL FOR OPTICAL AMPLIFIER GAIN CONTROL

(75) Inventors: Shawn-Yu Lin, Albuquerque, NM (US); James G. Fleming, Albuquerque, NM (US); Ihab El-Kady, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 324 days.

(21) Appl. No.: 10/607,065

(22) Filed: Jun. 25, 2003

(51) Int. Cl.
*H01S 4/00* (2006.01)
*F21V 9/00* (2006.01)
*G02F 1/00* (2006.01)

(52) U.S. Cl. .................. 359/333; 359/344; 359/359; 359/248

(58) Field of Classification Search ............... 359/333, 359/344, 359, 248
See application file for complete search history.

(56) References Cited

U.S. PATENT DOCUMENTS

| | | | | |
|---|---|---|---|---|
| 5,440,421 A | * | 8/1995 | Fan et al. | 359/245 |
| 5,600,483 A | * | 2/1997 | Fan et al. | 359/245 |
| 5,751,466 A | * | 5/1998 | Dowling et al. | 359/248 |
| 5,802,236 A | * | 9/1998 | DiGiovanni et al. | 385/127 |
| 6,097,870 A | * | 8/2000 | Ranka et al. | 385/127 |
| 6,111,472 A | * | 8/2000 | De Los Santos | 331/96 |
| 6,618,535 B1 | * | 9/2003 | Reynolds | 385/129 |
| 6,850,679 B1 | * | 2/2005 | Hasegawa | 385/125 |
| 2002/0045030 A1 | * | 4/2002 | Ozin et al. | 428/173 |
| 2002/0048289 A1 | * | 4/2002 | Atanackovic et al. | 372/20 |
| 2002/0164137 A1 | * | 11/2002 | Johnson et al. | 385/125 |
| 2002/0176676 A1 | * | 11/2002 | Johnson et al. | 385/125 |
| 2002/0181911 A1 | * | 12/2002 | Wadsworth et al. | 385/125 |
| 2003/0059185 A1 | * | 3/2003 | Russell et al. | 385/125 |
| 2003/0077058 A1 | * | 4/2003 | Russell et al. | 385/125 |
| 2003/0117699 A1 | * | 6/2003 | Maroney et al. | 359/342 |
| 2003/0180018 A1 | * | 9/2003 | Hasegawa | 385/125 |
| 2004/0053009 A1 | * | 3/2004 | Ozin et al. | 428/168 |
| 2004/0151450 A1 | * | 8/2004 | Wadsworth et al. | 385/123 |

FOREIGN PATENT DOCUMENTS

JP    2002314194    * 10/2002

OTHER PUBLICATIONS

Yokoyama et al., "Rate equation analysis of microcavity lasers," *J. Appl. Phys. 66* (10), 4801 (1989).
Ozbay et al., "Defect structures in a layer-by-layer photonic bandgap crystal," *Phys. Rev. B 51* (20), 13961 (1995).

(Continued)

*Primary Examiner*—Jack Keith
*Assistant Examiner*—Eric Bolda
(74) *Attorney, Agent, or Firm*—Kevin W. Bieg

(57) ABSTRACT

An optical amplifier having a uniform gain profile uses a photonic crystal to tune the density-of-states of a gain medium so as to modify the light emission rate between atomic states. The density-of-states of the gain medium is tuned by selecting the size, shape, dielectric constant, and spacing of a plurality of microcavity defects in the photonic crystal. The optical amplifier is particularly useful for the regeneration of DWDM signals in long optical fibers.

23 Claims, 14 Drawing Sheets

OTHER PUBLICATIONS

Villeneuve et al., "Microcavities in photonic crystals: Mode symmetry, tenability, and coupling efficiency," *Phys. Rev. B 54* (11), 7837 (1996).

Fan et al., "High Extraction Efficiency of Spontaneous Emission from Slabs of Photonic Crystals," *Phys. Rev. Lett. 78* (17), 3294 (1997).

Lin et al., "Photonic band-gap microcavities in three dimensions," *Phys. Rev. B 59* (24), R15579 (1999).

Sondergaard., "Spontaneous Emission in Two-Dimensional Photonic Crystal Microcavities," *IEEE J. Quantum Elect. 36* (4), 450 (2000).

Fan et al., "Rate-Equation Analysis of Output Efficiency and Modulation Rate of Photonic-Crystal Light-Emitting Diodes," *IEEE J. Quantum Elect. 36* (10), 1123 (2000).

John A. Buck, "Chapter 5: Optical Fiber Amplifiers," *Handbook of Optics,* vol. IV, McGraw-Hill (2001).

K. Sakoda, *Optical Properties of Photonic Crystals,* Springer Verlag (2001).

Pendry et al., "Calculation of Photon Dispersion Relations," *Phys. Rev. Lett. 69* (19), 2772 (1992).

J.B. Pendry, "Photonic band structures," *J. Mod. Optics. 41* (2), 209 (1994).

* cited by examiner

USE OF A PHOTONIC CRYSTAL FOR OPTICAL AMPLIFIER GAIN CONTROL

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to light amplification and, more particularly, to the use of a photonic crystal to control the gain profile of a doped optical amplifier.

BACKGROUND OF THE INVENTION

Optical communication signals can require signal regeneration over long optical fiber distances. In particular, with the advent of large-capacity optical fiber transmission based on Dense Wavelength Division Multiplexing (DWDM), optical amplifiers have become increasing important for the regeneration of DWDM signals carried in optical fibers. Erbium-doped fiber amplifiers (EDFAs) are particularly advantageous for optical signal regeneration because of their relatively low cost, high efficiency for amplification within the low-attenuation window of optical fibers, and low noise compared to other amplification schemes. In particular, erbium has useful gain at C-band wavelengths between about 1.53 µm and 1.62 µm where silica fibers have their lowest attenuation.

Conventional EDFAs comprise a short length of the optical fiber that is doped with a small amount of erbium added to the optical fiber glass as $Er^{3+}$. Typically, the erbium ion is pumped by a high-power light beam (e.g., from a laser diode) that is mixed with a longer-wavelength optical signal. The excited erbium ions can give up energy in the form of photons by stimulated emission, thereby amplifying an optical signal having the proper phase and propagation direction.

The utility of EDFAs for amplifying DWDM signals is determined by the uniformity and width of the erbium gain profile. DWDM signals use many wavelengths, or channels, within the erbium gain profile. Erbium-doped fiber amplifiers can simultaneously amplify multiple weak light signals at wavelengths across their gain profile, enabling long-distance transmission without requiring separate repeaters for the various DWDM channels carried by the fiber. Unfortunately, the intrinsic gain profile of erbium is highly non-uniform. For short fibers, requiring few amplifiers, or for single-mode signals, this is not much of a problem. However, for long optical fibers requiring cascaded EDFA chains, the difference in amplification at the different DWDM wavelengths due to the non-uniform erbium gain profile can result in an imbalance in the optical signal power and the signal-to-noise ratio among the DWDM channels.

Channel spacing is an important consideration for both transmission capacity and performance. The narrowness of the intrinsic gain profile limits the usable bandwidth and, therefore, the channel spacing. To increase the data transmission rate, the communication industry has tried for years to squeeze more optical channels into the limited erbium bandwidth. As the number of channels is increased, the individual channel width must be decreased accordingly. This requirement, in turn, puts tremendous demand on the stability of laser emission wavelength, filter line-width, and standard of calibration. An enhancement of 2 to 3 times in usable bandwidth would relieve such a strict requirement. Conversely, within the same requirement, increasing the bandwidth could increase the number of available channels by 2 to 3 times.

A number of approaches have been proposed to flatten and broaden the gain profile of erbium and obtain uniform amplification and greater bandwidth of DWDM signals. For example, the gain may be controlled by the introduction of other dopants or the addition of gain equalizing spectral filters. However, these approaches can lower the efficiency or output power and may complicate system operation. Therefore, there remains a need for a means to obtain a flat erbium gain profile over a broad wavelength range without deterioration of the signal-to-noise or amplification efficiency.

SUMMARY OF THE INVENTION

The present invention is directed to an optical amplifier comprising a photonic crystal, the photonic crystal comprising a periodic dielectric structure of at least two different dielectric materials and having a photonic bandgap; a gain medium within the periodic dielectric structure, the gain medium comprising a plurality of atoms capable of light emission within the photonic bandgap; and a plurality of microcavity defects within the periodic dielectric structure wherein the size, shape, dielectric constant, and spacing the microcavity defects are selected to tune the photonic density-of-states of the gain medium so as to modify the light emission rate between the atomic levels of the plurality of atoms. The invention further includes a method for light amplification, comprising providing the optical amplifier; pumping the plurality of atoms with a light excitation at a wavelength less than the photonic bandgap of the photonic crystal; and injecting into the photonic crystal an optical signal having a wavelength within the emission bandwidth of the gain medium to stimulate emission from the excited plurality of atoms. The optical amplifier can provide a flatter and broader atomic gain profile, particularly useful for the regeneration of DWDM signals in long optical fibers.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

FIG. 3A shows the use of a photonic bandgap gain transfer function to flatten a peaked gain profile. FIG. 3B shows the atomic transitions from the excited level substates of an emitting atom.

FIG. 4A shows the gain transfer functions for two microcavities. FIG. 4B shows the gain transfer functions for four microcavities.

FIG. 6A is a scanning electron micrograph showing a cross-sectional view of the vacancy defect in the fourth layer of the seven-layer silicon photonic crystal. FIG. 6B is a top view of two vacancy defects in a layer of the silicon photonic crystal.

FIG. 8A shows the transmission spectrum of an array having a large cavity spacing and a first cavity defect with a small vacancy length. FIG. 8B shows the transmission spectrum of an array having an intermediate cavity spacing and a first cavity defect with a small vacancy length. FIG. 8C shows the transmission spectrum of an array having a small cavity spacing and a first cavity defect with a large vacancy length.

DETAILED DESCRIPTION OF THE INVENTION

The cross section for spontaneous or stimulated emission depends on the host medium and the dopant atom. In particular, the rate of spontaneous or stimulated emission from the dopant atom scales with the density-of-states of the allowed states at the atomic transition frequency. The density-of-states of the emitting atom can be modified by the surrounding medium to tune the gain profile and emission wavelength. One way to modify the density-of-states is to invoke strong electron-photon interaction through the use of a photonic crystal, or photonic bandgap microcavities. Photonic structures are particularly attractive for modification of the density-of-states of an emitter, because of the flexibility in photonically engineering a structure that is tailored to suppress or enhance specific wavelengths.

Photonic crystals comprise periodic dielectric structures of at least two different dielectric materials. Photonic crystals have one or more photonic bandgaps wherein propagation of electromagnetic radiation in one or more dimensions is inhibited. By opening up bandgaps, photonic crystals have the ability to completely eliminate the density-of-states for a range of frequencies, thereby suppressing emission for radiative transition frequencies that fall within the bandgap of the photonic crystal. Conversely, a mode can be introduced within the bandgap of the photonic crystal by introduction of a microcavity, or cavity defect, within the crystal to enhance emission. If the radiative transition frequency of the atom matches that of the defect mode, the rate of spontaneous or stimulated emission can be enhanced. In particular, microcavities with small modal volume and high quality factor (e.g., Q ~1000) have been used to enhance emission and narrow the emission linewidth below the natural linewidth for light emitting diode (LED) and laser applications.

Figure 1:
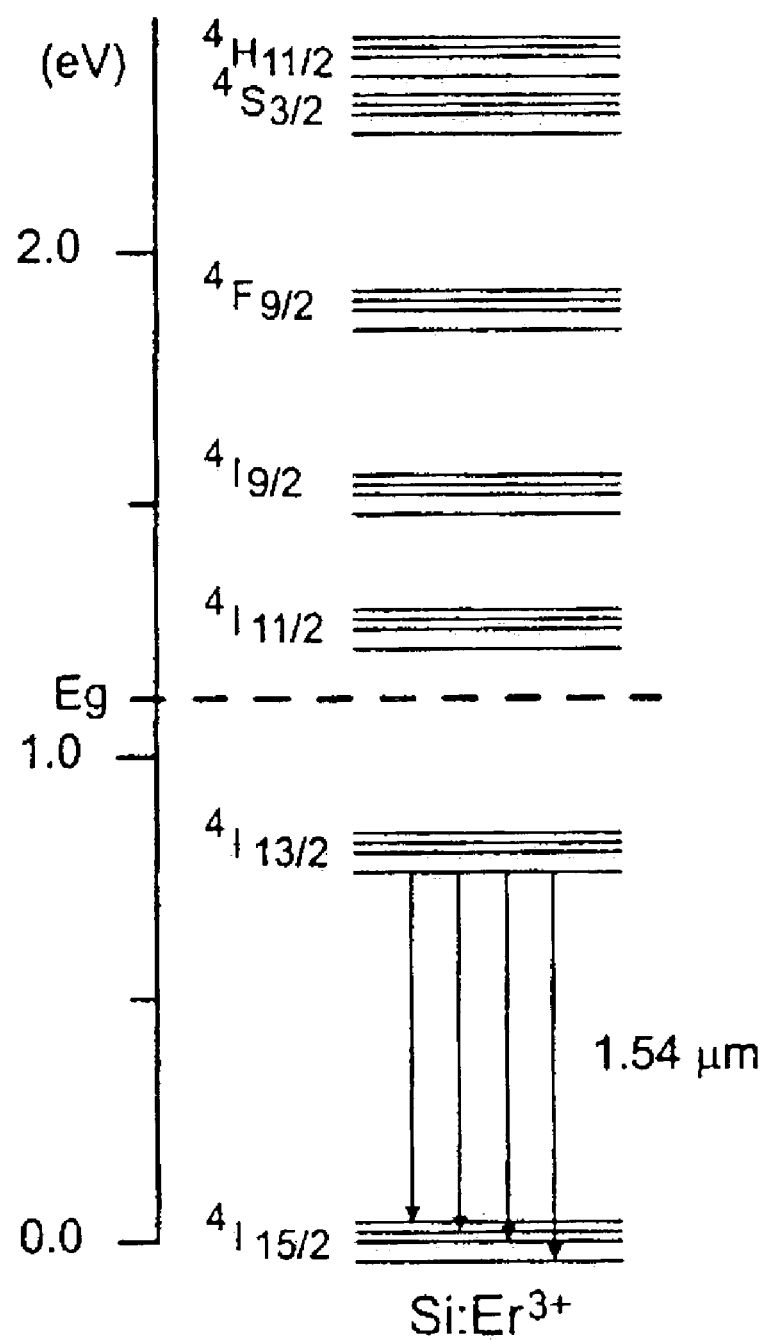
FIG. 1 shows a schematic diagram of the erbium atomic levels.

FIG. 1 shows the atomic energy levels of Si:$Er^{3+}$. In a conventional EDFA, the pump excitation populates one of the higher energy $^4I_{11/2}$–$^4H_{11/2}$ excited states, from which the excited electron rapidly decays to the $^4I_{13/2}$ first excited state. The $^4I_{13/2}$ excited state is metastable, with a half-life for spontaneous emission of about 11 milliseconds. The $^4I_{13/2}$ metastable state has 7 substates. A stimulated photon having the same energy, phase, and direction as a signal photon is emitted when the excited electron jumps back to the $^4I_{15/2}$ ground state from the $^4I_{13/2}$ metastable state, thereby providing signal amplification.

Figure 2:
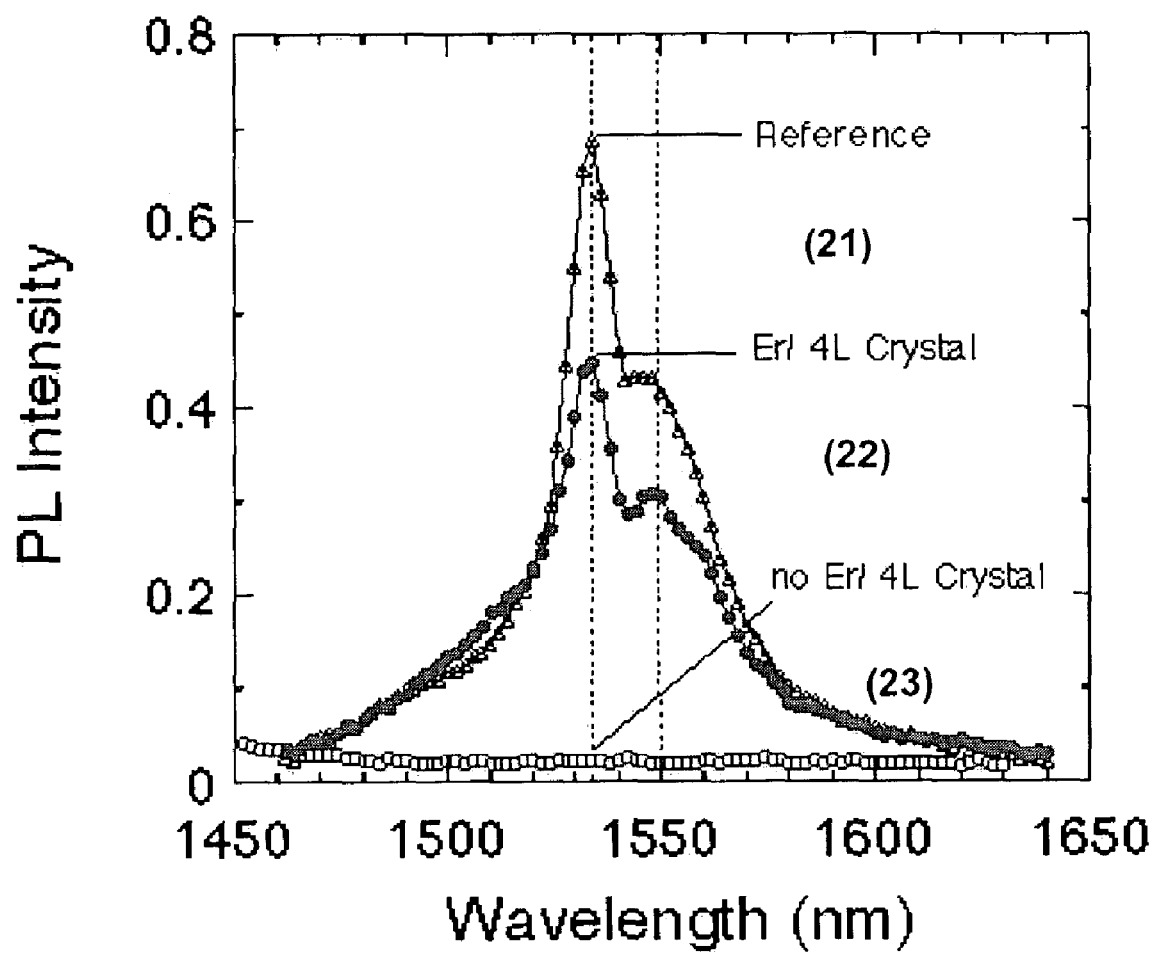
FIG. 2 shows the gain profiles of erbium in silicon, erbium in a silicon photonic crystal having a bandgap at the erbium emission wavelength, and for an undoped silicon photonic crystal.

FIG. 2 shows the emission gain profiles for erbium in silicon. The intrinsic gain profile 21 of erbium has an emission bandwidth that extends from 1520 nm to 1570 nm, but is narrow and highly non-uniform. A suppressed gain profile 22 can be obtained by embedding the erbium in a four-layer silicon photonic crystal having a bandgap at the erbium emission wavelength of about $\lambda$=1.55 $\mu$m. As expected, no emission 23 is observed in this bandgap region for the four-layer silicon photonic crystal without the erbium gain medium. This demonstrates the ability of the photonic crystal to suppress the erbium gain profile by modification of the local density-of-states of erbium.

The density-of-states of an emitting atom can be tuned by alteration of the size, shape, and dielectric constant of a microcavity in a photonic crystal containing the gain medium. Rather than strictly enhancing or suppressing emission within the bandgap, an array of such microcavities can be introduced into the photonic crystal to redistribute the emission of a gain medium by suitable modification of the density-of-states of the emitting atoms. In the present invention, this tunability is exploited with low-Q microcavities to control the gain profile of the emitting atom over a broad bandwidth. Such a microcavity system is capable of altering the emission rate between various atomic levels. In particular, the density-of-states of the microcavities can be photonically engineered to provide gain equalization and transform a highly peaked gain profile into a flat one, thereby increasing the usable bandwidth of an optical amplifier.

Figure 3A:
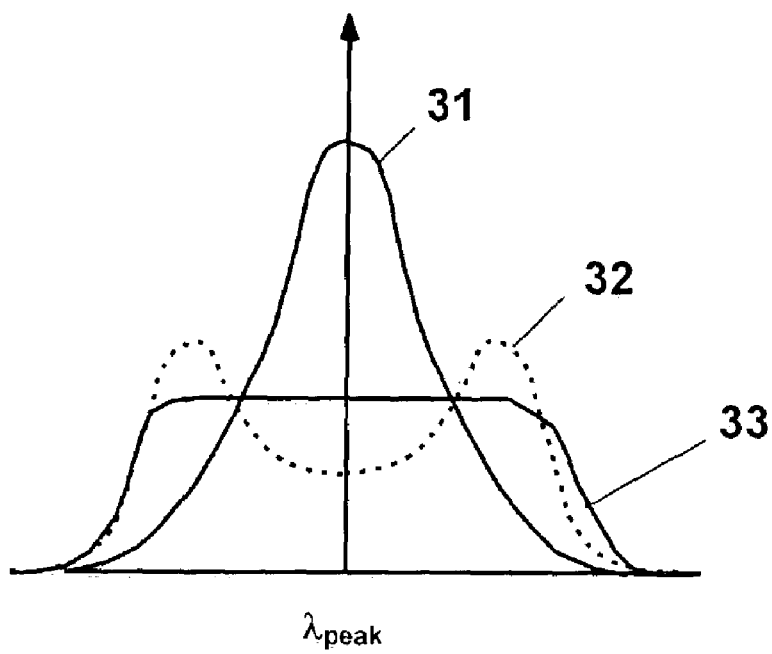
FIGS. 3A and 3B illustrate modification of the gain profile of an emitting atom by a photonic crystal.
Figure 3B:
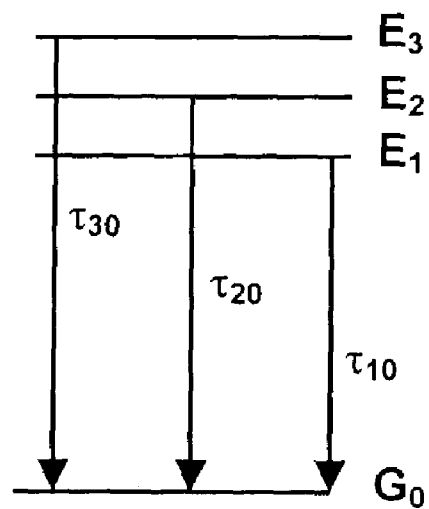

FIGS. 3A and 3B show conceptually how detailed engineering of the photonic density-of-states is possible to modify the gain profile of an emitting atom using photonic bandgap microcavities. FIG. 3A illustrates how a photonic bandgap gain transfer function 32 equalizes and broadens the natural emission gain profile 31 of an emitting atom. An array of microcavities can be engineered to modify the photonic density-of-states of the emitting atom to enhance the allowed transitions to be outside of the natural atomic transition bandwidth and suppress emission at the natural emission peak frequency. The transition bandwidth of the modified gain profile 33 can thereby be increased (e.g., from 50 nm to about 100 nm for erbium) and the gain made uniform over this broad bandwidth.

The radiative transitions from the various excited-state sublevels can be enhanced or suppressed by modification of the photonic density-of-states. In FIG. 3B is shown a conceptual illustration of the atomic transitions between three excited level substates $E_i$ and a ground state $G_0$. The emission rates between each of the excited level substates $E_i$ and the ground state $G_0$ will vary depending on transition rules. In general, the intrinsic gain profile 31 of an emitting atom is non-uniform, due to the difference in the radiative lifetimes and population densities between the excited substates and the ground state. The relative emission rates between the $i^{th}$ excited sublevel $E_i$ and the ground state $G_0$ is dependent upon the product, $s_i/\tau_{i0}$, of the density-of-states, $s_i$, and the inverse of the radiative lifetime, $\tau_{i0}$. The natural emission gain profile 31 in FIG. 3A is obtained when the product of the density-of-states and the inverse lifetime for the central excited sublevel, $s_2/\tau_{20}$, is larger than those of the other excited state sublevels, $s_1/\tau_{i0}$ and $s_3/\tau_{30}$. However, the emission rates between the substates and the ground state can be altered through the tuning of the density-of-states, $s_i$, of the excited state sublevels by a photonic bandgap cavity. If properly engineered, $s_i/\tau_{i0}$ can be made equal for all of the sublevels, providing the uniform gain profile 33. Importantly, energy is only redistributed and not lost by this transformation, as would be the case if the high intensity radiation were spectrally filtered to equalize the gain profile, as is done with some conventional EDFAs.

Figure 4A:
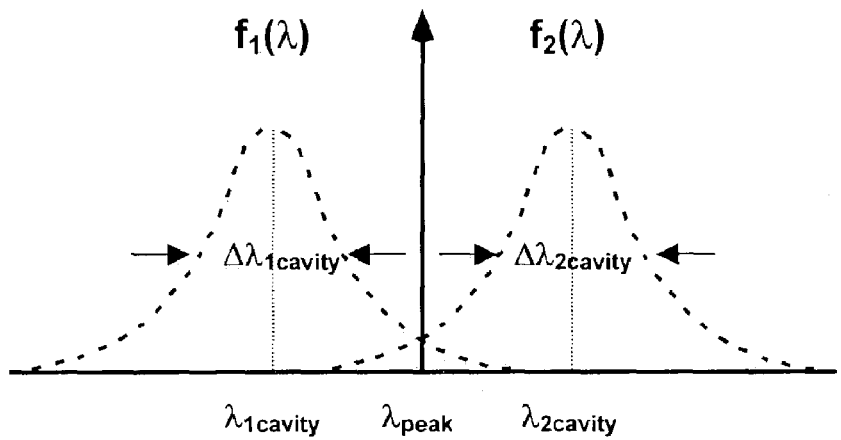
FIGS. 4A and 4B show how an arbitrary photonic bandgap gain transfer function can be achieved with multiple microcavities.
Figure 4B:
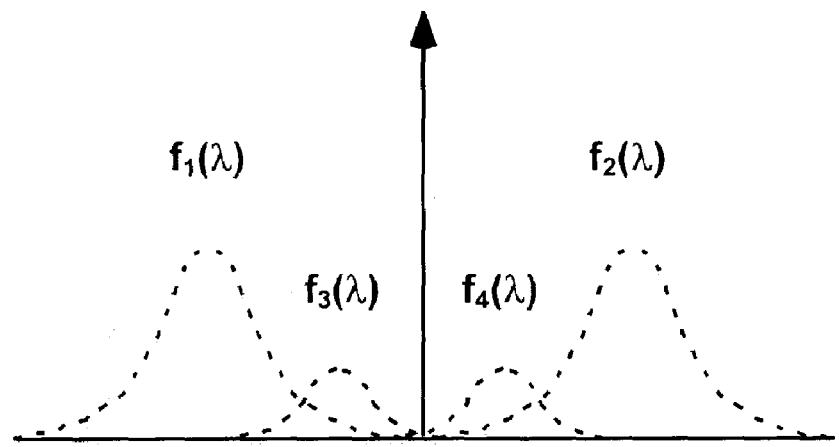

FIGS. 4A and 4B show how an arbitrary gain transfer function can be realized using multiple microcavities. Tailoring of the density-of-states of the gain medium can be achieved with a plurality of microcavities. The emitting atoms has a peak natural emission wavelength $\lambda_{peak}$ that is within the bandgap of the photonic crystal. Each microcavity has a gain transfer function with a peak cavity wavelength $\lambda_{icavity}$, displaced from the peak natural emission wavelength $\lambda_{peak}$, and with linewidth $\Delta\lambda_{icavity}$. The peak cavity wavelength $\lambda_{icavity}$ and linewidth $\Delta\lambda_{icavity}$ can be tuned by alteration of the size, shape, and dielectric constant of the microcavity and the bandgap properties of the photonic crystal. In general, it is preferable that the gain transfer function of each microcavity have a broad linewidth. The linewidth is related to the cavity quality factor as $Q_i=\lambda_{icavity}/\Delta\lambda_{icavity}$. Cavity Q is a measure of the localization of the microcavity wavefunction, which is most strongly influenced by the thickness of the photonic crystal (e.g., the number of lattice layers), size of the bandgap, and crystal quality.

FIG. 4A shows the gain transfer functions for two microcavities, $f_1(\lambda)$ and $f_2(\lambda)$, each with a gaussian-like photonic density-of-states. The gain transfer functions have peak cavity wavelengths, $\lambda_{1cavity}$ and $\lambda_{2cavity}$, displaced from the peak natural emission wavelength, $\lambda_{peak}$, and with linewidths, $\Delta\lambda_{1cavity}$ and $\Delta\lambda_{2cavity}$. In general, if the natural emission gain profile 31 of the emitting atom is symmetric about the peak emission wavelength $\lambda_{peak}$, it is preferable to provide a symmetric gain transfer function 32 in order to provide a uniform gain profile 33. Therefore, the peak amplitudes, $f_1(\lambda_{1cavity})$ and $f_2(\lambda_{2cavity})$, and the quality factors, $Q_1$ and $Q_2$, of the microcavity gain transfer functions are preferably equal. Furthermore, the separation ($\lambda_{1cavity}-\lambda_{2cavity}$) of the gain transfer functions can be controlled to broaden the transition bandwidth of the gain profile 33. The peak amplitudes, peak separations, and quality factors of the gain transfer functions can be controlled by proper selection of the size, shape, dielectric constant, and spacing of the microcavities.

FIG. 4B illustrates how a more detailed modulation of the photonic density-of-states can be achieved by the combination of microcavities with different gain transfer functions $f_1(\lambda)$, $f_2(\lambda)$, $f_3(\lambda)$, and $f_4(\lambda)$. By using a plurality of microcavities, a gain medium with an arbitrarily shaped natural emission gain profile 31 can be modified to provide an arbitrarily shaped gain profile 33.

Figure 5:
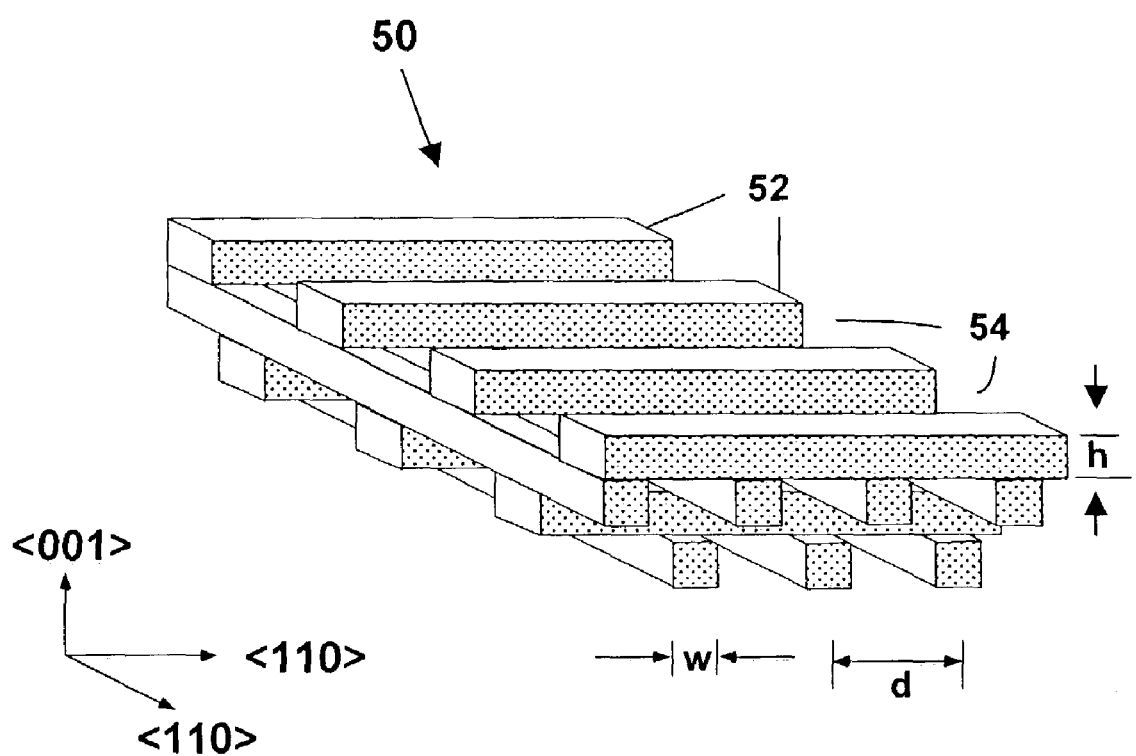
FIG. 5 shows a Lincoln-Log type photonic crystal structure.

Many types of photonic crystal structures are suitable for the present invention. The photonic crystal can have one-, two-, or three-dimensional periodicity. Preferably, the photonic crystal has 3D periodicity, providing a complete photonic bandgap, to enable directional control of the light propagation in all three dimensions. A 3D "Lincoln-Log" type photonic crystal structure, as shown in FIG. 5, has been extensively studied theoretically and experimentally. Furthermore, a microcavity defect structure can be precisely and systematically introduced in this layer-stacking structure using known fabrication methods. The Lincoln-Log structure 50 consists of layers of one-dimensional rods 52 in air 54 with a stacking sequence that repeats itself every four layers. Within each layer, the rods 52 are parallel to each other and have a fixed pitch (d), a fixed width (w), and height (h). The orientation of the rods 52 on alternate layers is rotated 90° between layers. Between every over layer, the rods 52 are shifted relative to each other by an amount equal to half the pitch between the rods 52. For the special case of $4h/d=1.414$, the lattice can be derived from a faced-centered-cubic unit cell with a basis of two rods.

A Lincoln-Log silicon photonic crystal is described by Lin et al., "Photonic band-gap microcavities in three dimensions", *Phys. Rev. B* 59, R15579 (1999), which is incorporated herein by reference. Such a silicon photonic crystal can be fabricated by advanced silicon processing techniques, as disclosed in U.S. Pat. No. 6,358,854 to Fleming and Lin and U.S. Pat. No. 5,998,298 to Fleming et al., which are incorporated herein by reference. The refractive index contrast between polysilicon and air is about 3.6:1 at infrared wavelengths. To achieve the maximum 3D bandgap, the silicon photonic crystal fabricated by Lin et al. had a rod pitch of $d=4.2$ μm, width of $w=1.2$ μm, and height of $h=1.6$ μm. The filling fraction of polysilicon for this Lincoln-Log structure is about 28%. This silicon photonic crystal exhibited a complete 3D bandgap from wavelengths of about $\lambda=10$ to 15 μm.

A microcavity defect can be introduced into a photonic crystal by varying the dielectric function in a local region of the crystal lattice. The defect can be a vacancy defect, wherein a section of the dielectric material is removed, or an interstitial defect, wherein extra dielectric material is added into the photonic crystal. The photonic defect state may appear in the otherwise forbidden photonic bandgap regime, providing a strongly localized state.

Figure 6A:
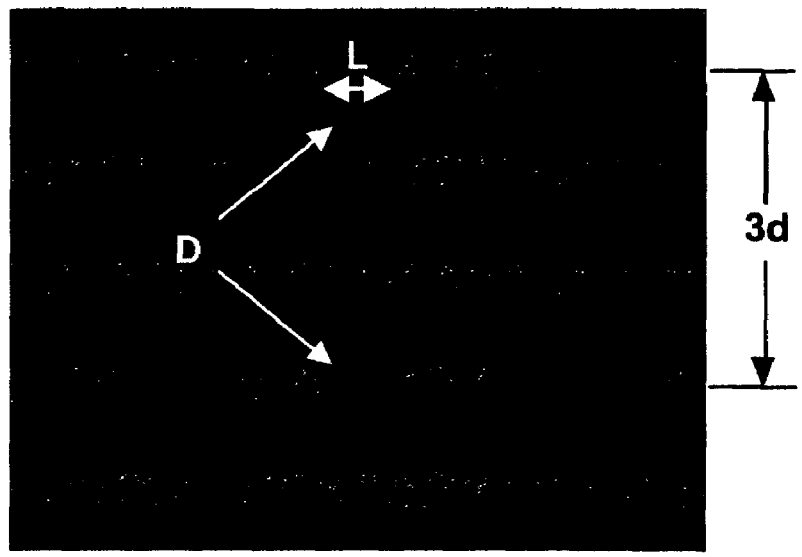
FIGS. 6A and 6B show scanning electron micrographs of a vacancy defect in a seven-layer Lincoln-Log silicon photonic crystal.
Figure 6B:
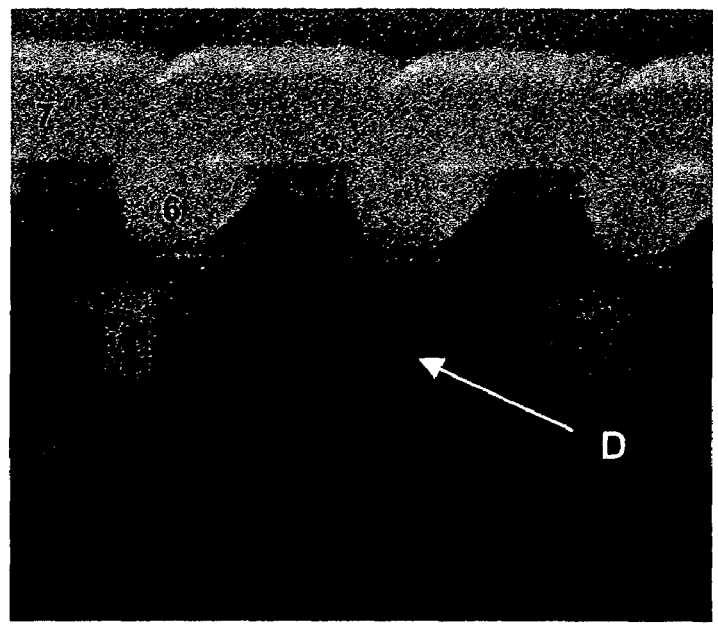

In particular, one or more vacancy defects can be incorporated into a specific stacking layer of the Lincoln-Log structure during the fabrication process. FIG. 6A shows a cross-section scanning electron micrograph (SEM) of a vacancy defect D in the fourth layer of the seven-layer silicon photonic crystal, as described by Lin et al. FIG. 6B shows a top view of the SEM image of two vacancy cavities in the same layer. The defects are spaced by two rods. The defect has a vacancy length L along the 1D rod. For a defect cavity having a vacancy of length $L=2$ μm, the cavity mode had a transmission centered at $\lambda_{cavity}=12$ μm within the silicon photonic crystal bandgap. The cavity defect had a quality factor Q of 15 (i.e., $\Delta\lambda_{cavity}=\lambda_{cavity}/Q=0.8$ μm).

For telecommunication applications, it is desired that the photonic bandgap be in the near-infrared optical fiber window. Extrapolation from the results of Lin et al. indicates that, to obtain a silicon photonic crystal with a bandgap centered at $\lambda_{peak}=1.55$ μm requires a rod pitch of $d=0.39$ μm and width $w=0.13$ μm.

In addition, for telecommunications, optical waveguiding is necessary to suppress isotropic emission and achieve directional photonic output of the amplified signal. Optical waveguiding can be achieved through weak coupling between the otherwise localized microcavities. In particular, the directional output can be enhanced by altering the modal wave-function symmetry, either by changing the geometric shape of the microcavity or by cavity-to-cavity interaction. The wave-function extent of a microcavity state is related to the localization length. When the distance between adjacent microcavities is comparable to the localization length in the defect layer, nearby microcavities can interact and defect modal frequencies shift. As photons propagate from one microcavity to another, photonic transport is realized through successive hopping. Hopping conduction can be terminated if the arrangement of microcavities is random or the spacing between adjacent microcavities too big. In particular, there is a critical distance below which photon waves are de-localized and hoping conduction is realized. If the microcavities are spaced at a distance less than the critical distance, optical waveguiding of the amplified photons can be achieved. Lin et al. observed weak coupling between vacancy defects for defect spacings of less than about four times the rod pitch. Therefore, for the Lincoln-Log silicon photonic crystal with a bandgap centered in the near-infrared at $\lambda_{cavity} \sim 1.55$ μm and rod pitch of d=0.39 μm, the cavity spacing should preferably be less than about 4d=1.56 μm to obtain optical waveguiding of the amplified signal.

Therefore, the microcavities can be arranged in a coupled array to achieve directional output of the tuned emission from a doped photonic crystal. The coupled array can be a 1D or 2D array to provide light propagation in one or more directions. The array can comprise a plurality of microcavity defects in one or more planes of the photonic crystal structure. The plurality of microcavities can have one or more size, shape, dielectric constant, and spacing. Transfer-matrix calculations can be used to determine the optimum defect parameters to modify the photonic density-of-states and equalize the gain profile of the emitting atom. See Pendry et al., "Calculation of Photon Dispersion Relations," *Phys. Rev. Lett.* 69 (19), 2772 (1992) and J. B. Pendry, "Photonic band structures," *J. Mod. Optics* 41 (2), 209 (1994).

Figure 7:
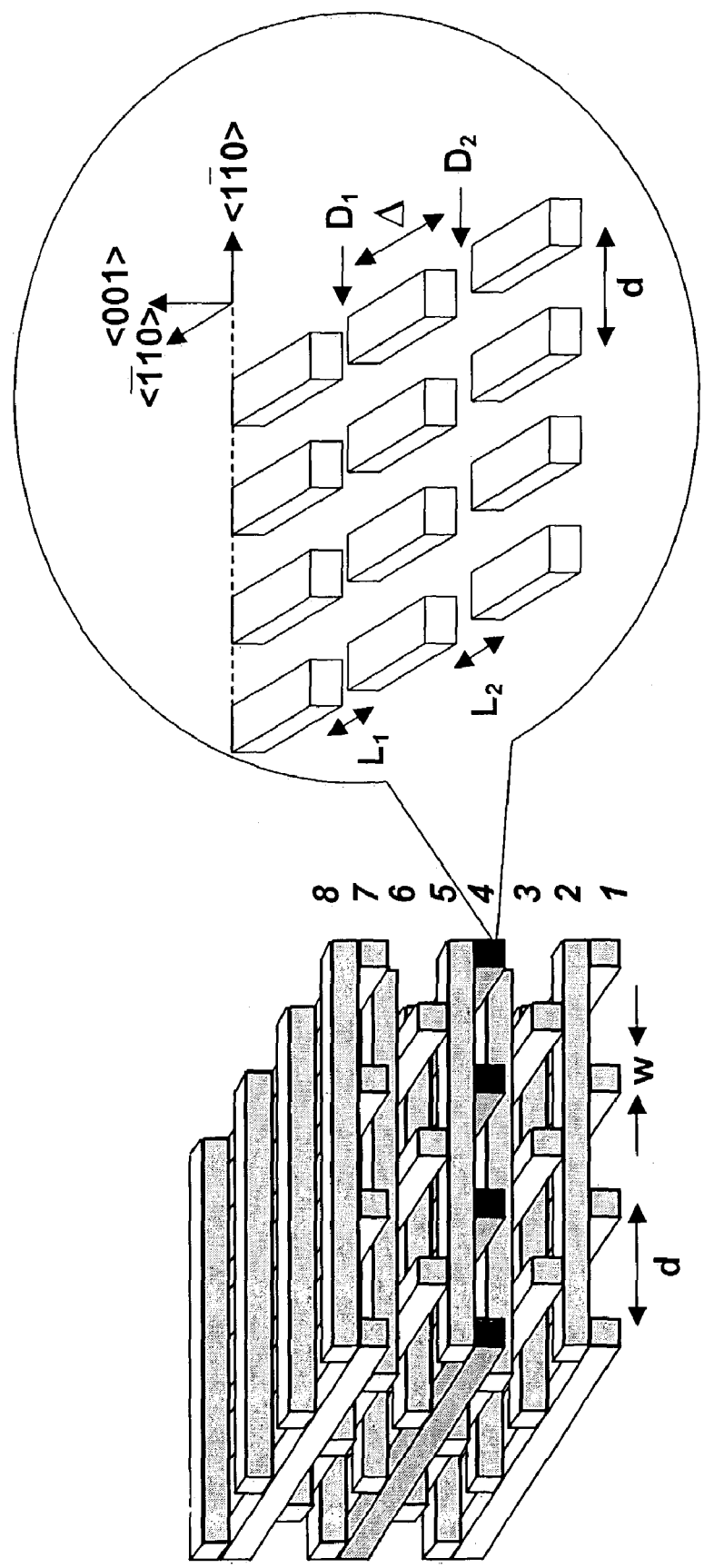
FIG. 7 illustrates an array of coupled cavity defects in the fourth layer of a Lincoln-Log photonic crystal.

In FIG. 7 is shown an eight-layer Lincoln-Log type silicon photonic crystal structure with a 1D array of two different cavity defects $D_1$ and $D_2$, having vacancy lengths $L_1$ and $L_2$, in the fourth layer. Light can propagate in the (1$\bar{1}$0) crystal direction. Transfer-matrix calculations were performed on this eight-layer structure to examine the gain transfer functions of the coupled microcavities in more detail. The modeled photonic crystal structure had a rod pitch of d=0.39 μm, width of w=0.13 μm, and height of h=0.12 μm. The vacancy length $L_1$ of the first cavity defect $D_1$ was varied from 0.13 to 0.26 μm (i.e., 0.34d to 0.66d) and the vacancy length $L_2$ of the second cavity defect $D_2$ was fixed at 0.26 μm (i.e., 0.66d). The end-to-end spacing $\Delta$ of the cavities was varied from 0.06 to 0.39 μm (i.e., 0.15d to 1.0d). The simulations assume a perfect crystal structure and do not take into account fabrication imperfections.

Figure 8A:
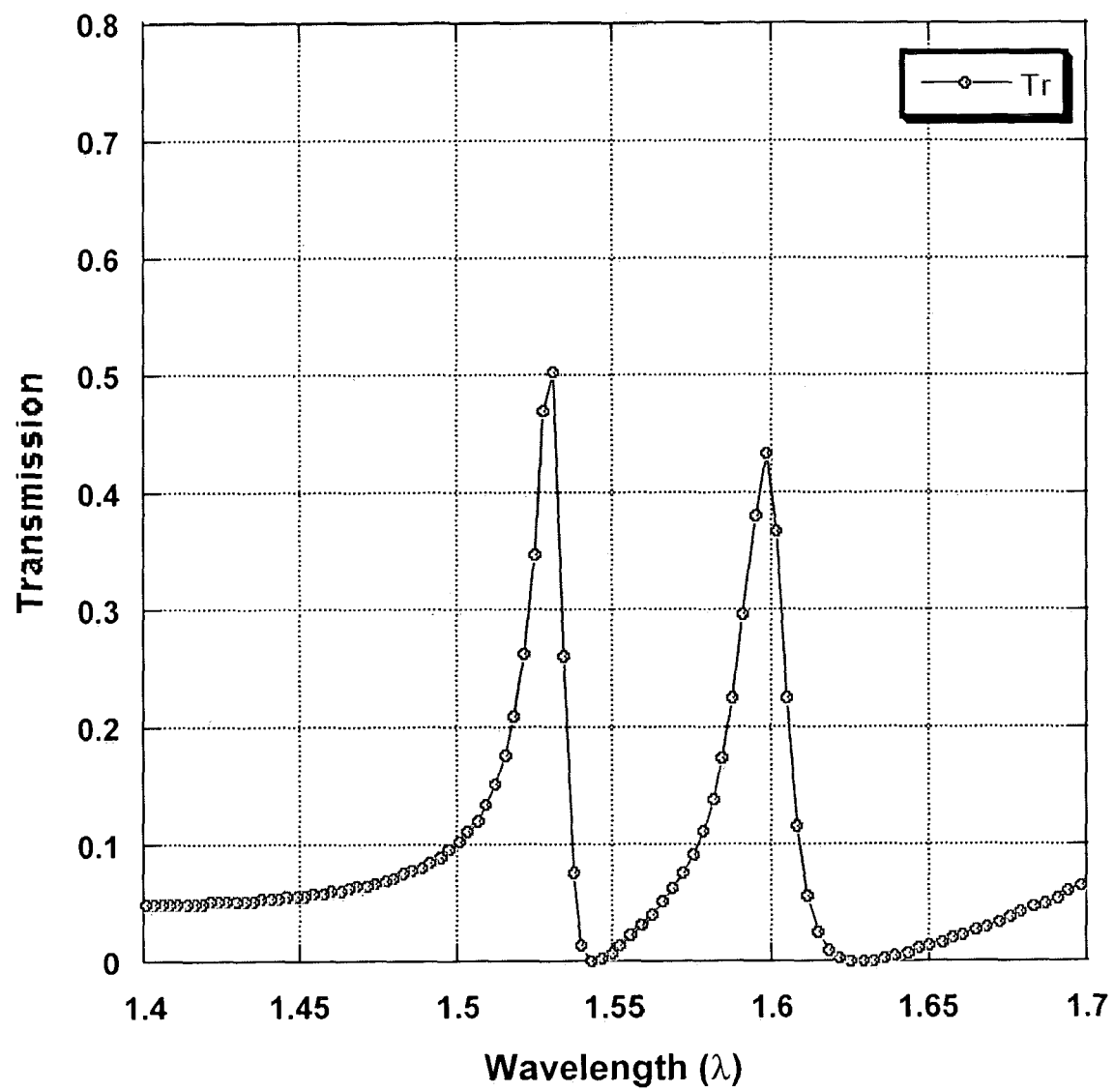
FIGS. 8A–8C show transmission spectra for an eight-layer Lincoln-Log silicon photonic crystal having an array of coupled cavity defects with different cavity sizes and spacings, calculated using a transfer matrix model.
Figure 8B:
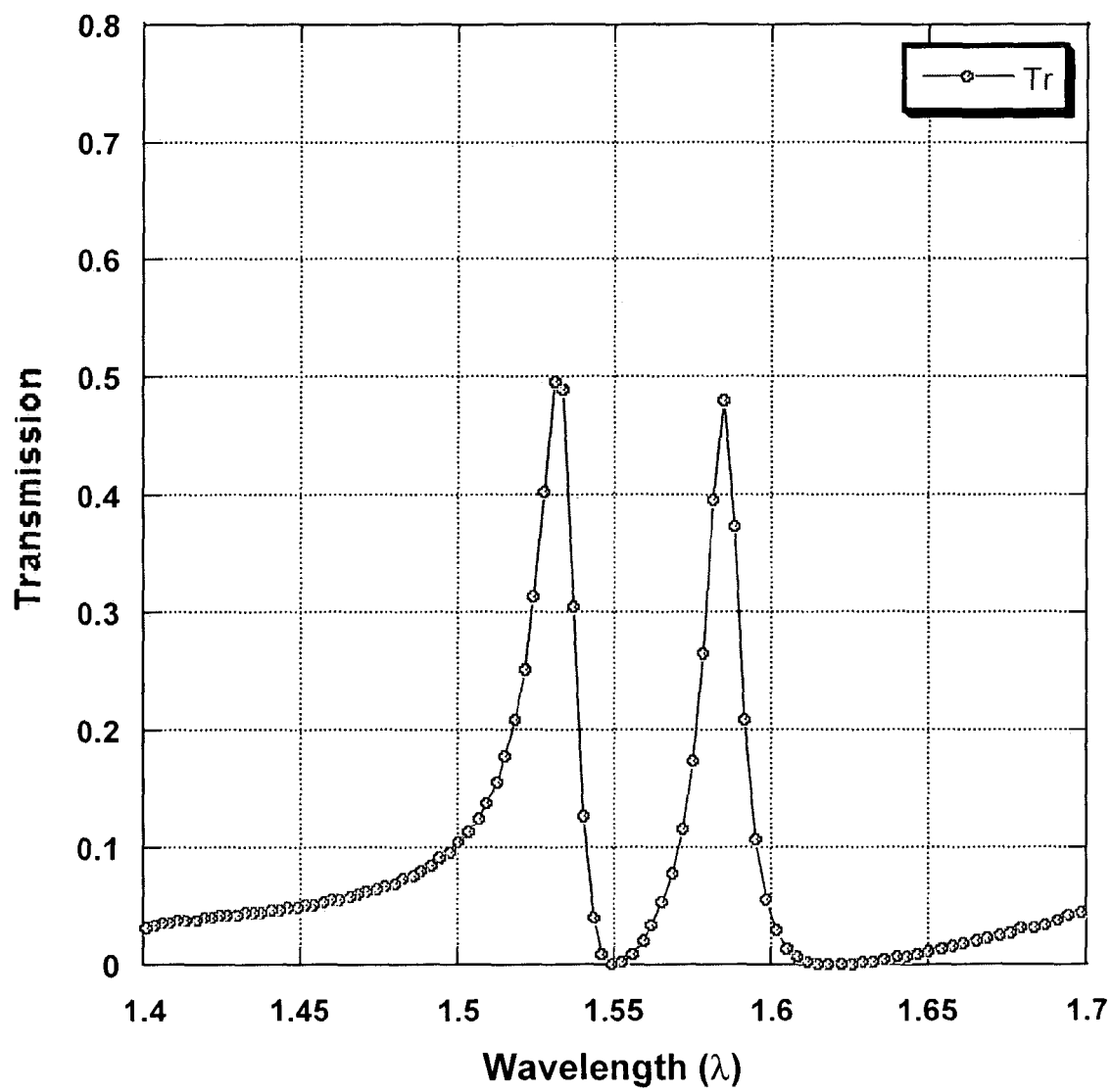
Figure 8C:
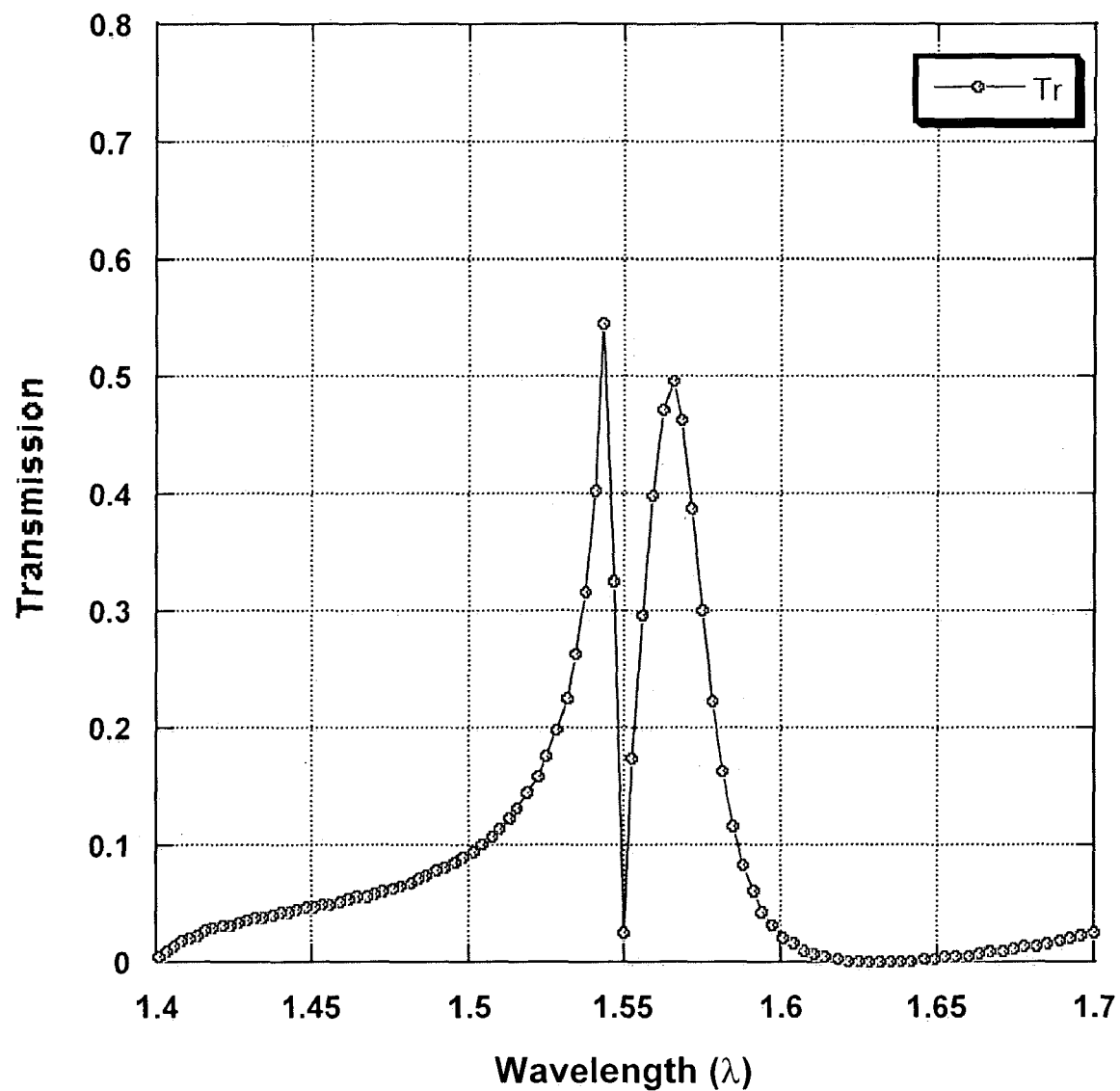

In FIGS. 8A–8C are shown calculated transmission spectra for coupled cavity defects having different cavity sizes and spacings. FIG. 8A shows the transmission spectrum of an array wherein the vacancy length of the first cavity defect $D_1$ was $L_1$=0.13 μm and the spacing of the cavities was $\Delta$=0.39 μm. The transmission peaks are separated by about 66 nm and linewidths are about 15–20 nm. FIG. 8B shows the transmission spectrum of an array wherein the vacancy length of the first cavity defect $D_1$ was $L_1$=0.13 μm and the spacing of the cavities was $\Delta$=0.2 μm. The transmission peaks are separated by about 51 nm and the linewidths are about 15–20 nm. FIG. 8C shows the transmission spectrum of an array wherein the vacancy length of the first cavity defect $D_1$ was $L_1$=0.26 μm and the spacing of the cavities was $\Delta$=0.06 μm. The transmission peaks are separated by about 23 nm and the linewidths are about 15–25 nm. Fabrication imperfections generally cause an increase in the linewidth by a factor of about 1.35 times these calculated linewidths.

Figure 9:
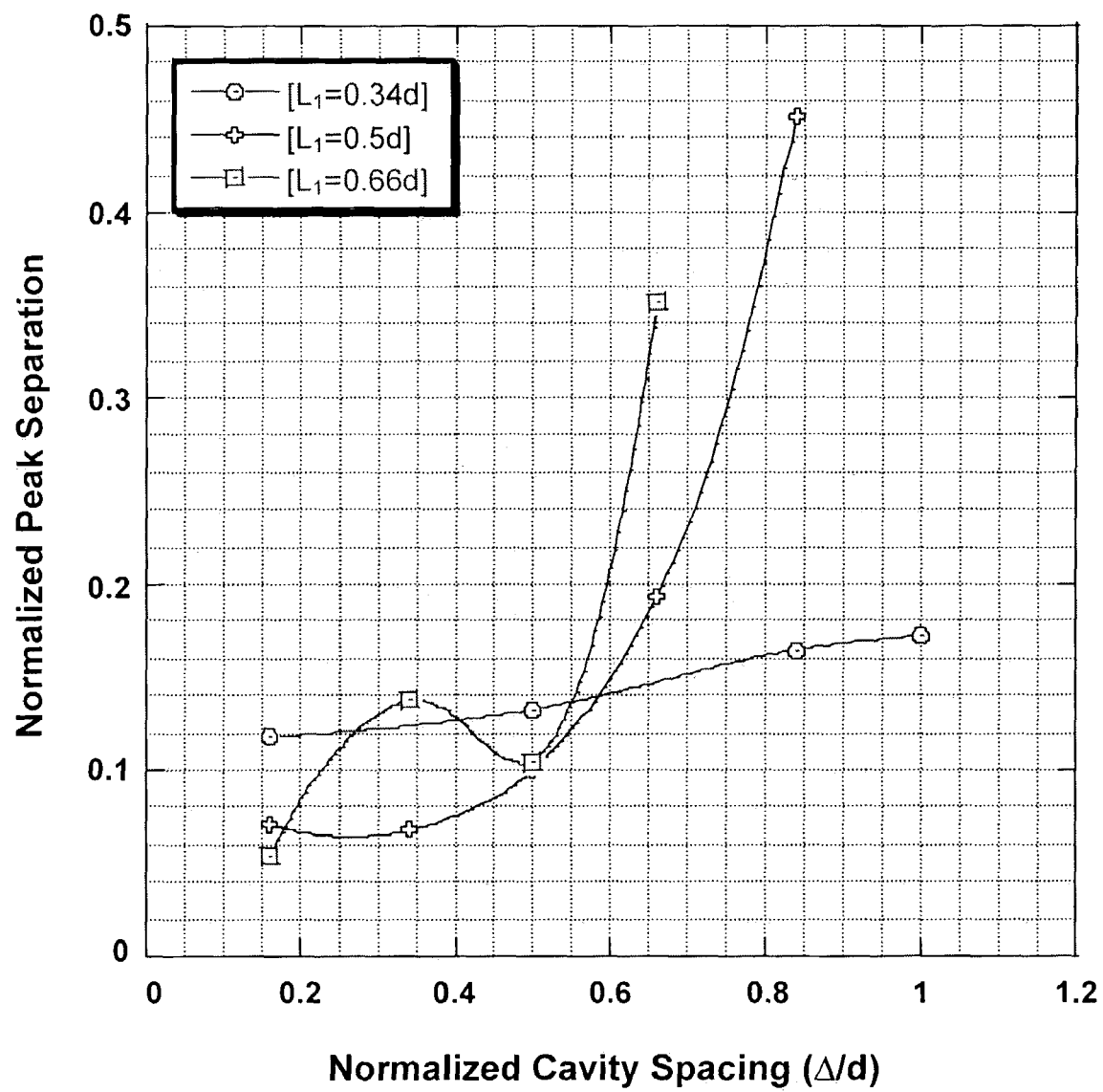
FIG. 9 shows the transmission peak separation normalized to the rod pitch as a function of the normalized cavity spacing for a first cavity defect with variable vacancy lengths.

The results of the transfer matrix calculations are summarized in FIGS. 9–12. In FIG. 9 is shown the transmission peak separation normalized to the rod pitch, d, as a function of the normalized cavity spacing, $\Delta$/d, for first cavity defects having variable vacancy lengths. For the erbium-doped silicon photonic crystal with d=0.39 μm, the preferred peak separation is about 30–40 nm. Therefore, the normalized peak separation is about 0.7–1.0, indicating a preferred normalized cavity spacing of less than $\Delta$/d=0.5. For the larger microcavities, the peak separation increases rapidly as the cavity spacing is increased.

Figure 10:
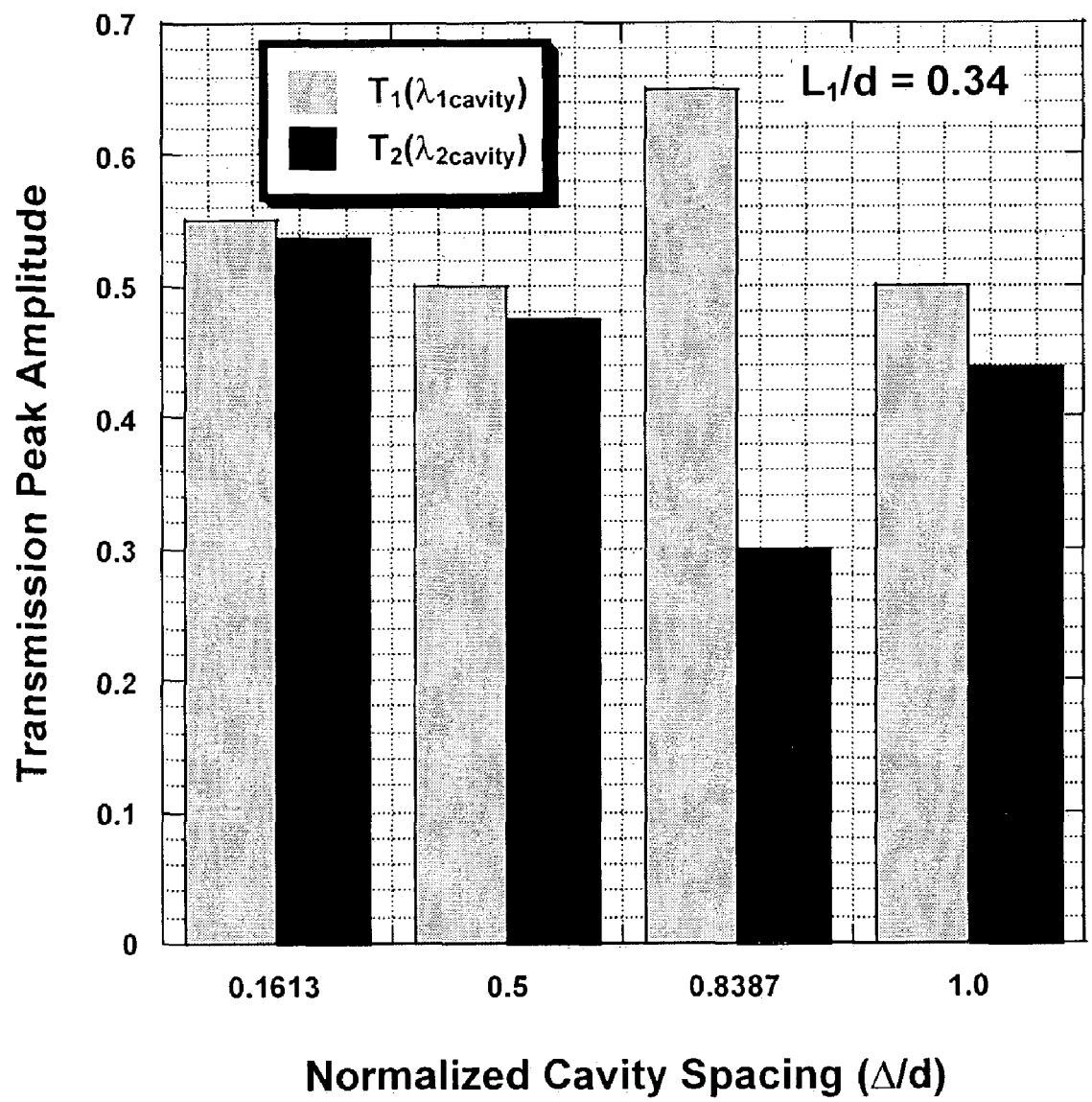
FIG. 10 shows the relative transmission peak amplitudes as a function of normalized cavity spacing for a first cavity defect with a fixed vacancy length.

In FIG. 10 are shown the relative transmission peak amplitudes as a function of normalized cavity spacing for a first cavity defect with a fixed vacancy length of $L_1$=0.34d. To achieve a symmetric gain transfer function, the transmission peak amplitudes of the first and second microcavities are preferably equal. The transmission peak amplitudes are approximately equal for normalized cavity spacings of less than $\Delta$/d=0.5.

Figure 11:
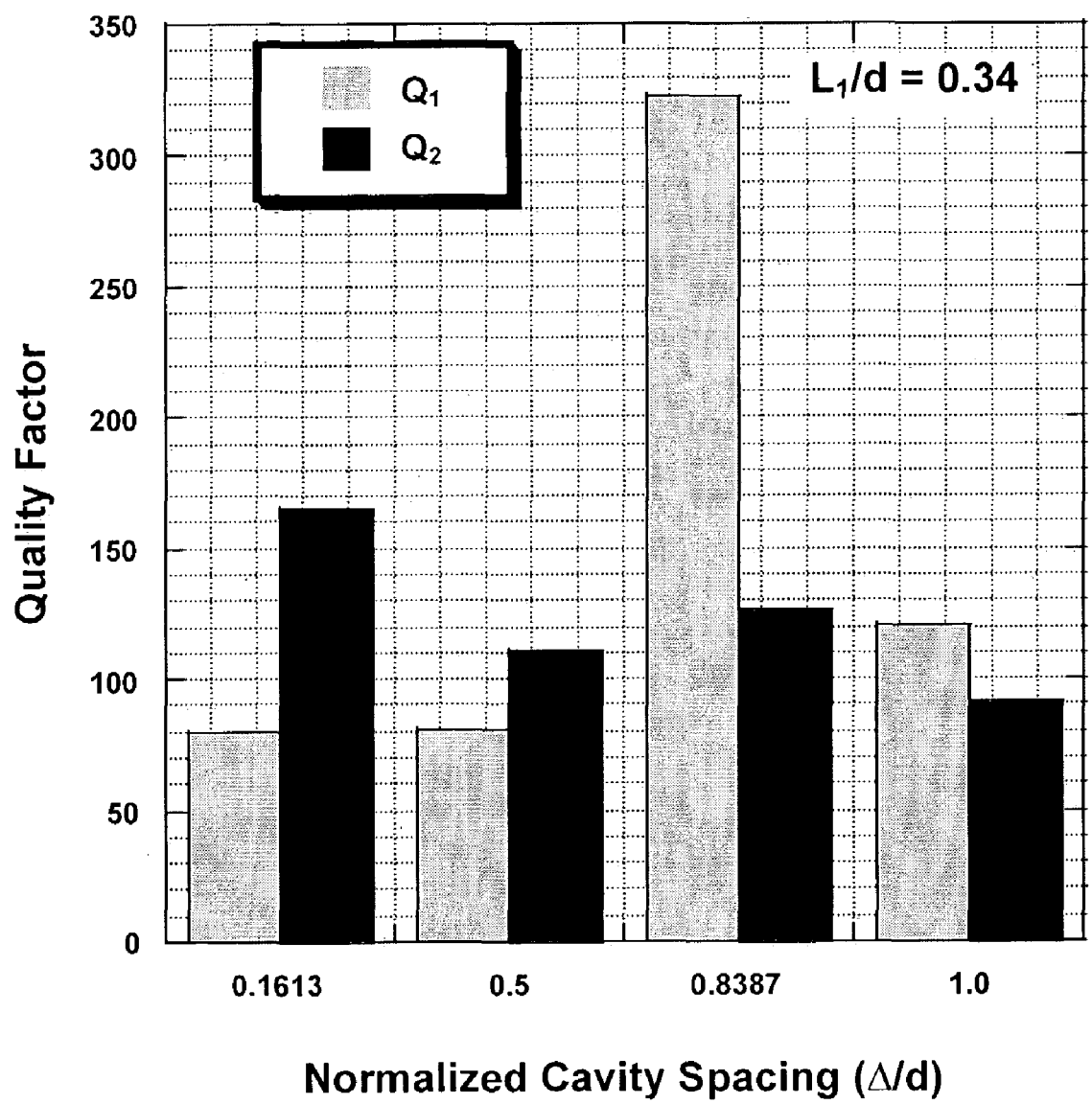
FIG. 11 shows the relative quality factors as a function of the normalized cavity spacing for a first cavity defect with a fixed vacancy length.

In FIG. 11 are shown the relative quality factors of the transmission peaks as a function of the normalized cavity spacing for a first cavity defect with a fixed vacancy length of $L_1$=0.34d. To achieve a symmetric gain transfer function, the quality factors, $Q_1$ and $Q_2$, of the first and second microcavities are preferably equal and low.

Figure 12:
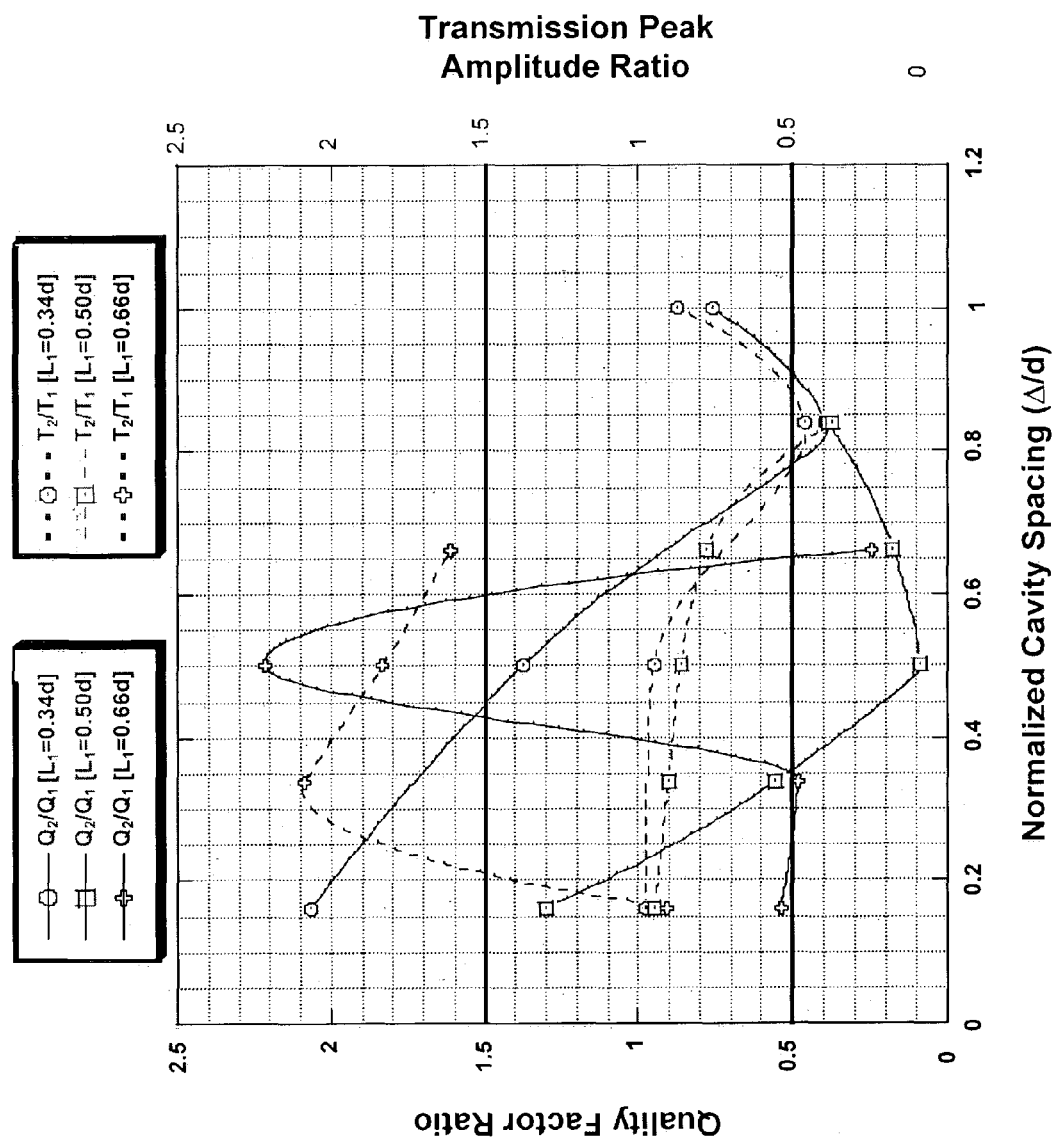
FIG. 12 shows the quality factor ratio and transmission peak amplitude ratio of the coupled microcavities as a function of the normalized cavity spacing for a first cavity defect with variable vacancy lengths.

In FIG. 12 are shown plots of the quality factor ratio and transmission peak amplitude ratio of the coupled microcavities as a function of the normalized cavity spacing for first cavity defects having variable vacancy lengths. To achieve a symmetric gain transfer function, both the quality factor ratio and the transmission peak amplitude ratio are preferably about 1. This can be achieved with a first cavity defect having a vacancy length of $L_1$=0.50d and a normalized cavity spacing of $\Delta$/d=0.25. Therefore, for the erbium-doped silicon photonic crystal with d=0.39 μm and a second cavity defect length of $L_2$=0.26 μm, the first cavity defect length is preferably about $L_1$=0.2 μm and the cavity spacing is preferably about $\Delta$=0.1 μm.

These results indicate that the peak cavity wavelengths, peak separation, and linewidths of the optical transmission (related to the gain transfer function through the density-of-states) of coupled cavity modes can be controlled by proper selection of the defect parameters (i.e., size, shape, dielectric constant and spacing). See, e.g., K. Sakoda, *Optical Properties of Photonic Crystals*, Springer Verlag (2001). If such a microcavity system is doped with a gain medium, such as rare earth atoms, a new class of optical amplifier is thereby created. The photonic crystal can be locally doped proximate the emitting atoms (i.e., within a localization length of the microcavities) or, preferably, in-situ doped uniformly through the crystal structure during fabrication. The atoms can be pumped with excitation light having a wavelength less than the bandgap of the photonic crystal. An optical signal having a wavelength within the emission bandwidth of the gain medium can be injected into the photonic crystal to stimulate emission from the excited atoms.

The optical amplifier has general applicability to any gain medium for which it is desired to modify the gain profile. In particular, cavity defect parameters can be selected to provide a flatter gain profile for an Er-doped silicon photonic crystal optical amplifier. Compared to the widely used Er-doped fiber amplifiers, the photonically engineered optical amplifier could have an at least two times wider bandwidth and a flat gain profile. Both are highly desirable for DWDM applications. The technique could also be used to modify the gain profile of ytterbium-doped fibers, praseodymium-doped glass for optical amplification in the O-band region, or thulium-doped glass for S-band light amplification.

The present invention has been described as an optical amplifier using a photonic crystal for gain control. An Er-doped silicon photonic crystal comprising a plurality of microcavity defects, useful for optical amplification for telecommunications signals, has been provided as an example of the present invention. It will be understood that the above description is merely illustrative of the applications of the principles of the present invention, the scope of which is to be determined by the claims viewed in light of the specification. Other variants and modifications of the invention will be apparent to those of skill in the art. Those skilled in the art will appreciate that the invention has general utility as a technique to modify the transition profile of an optical medium.

We claim:

1. An optical amplifier, comprising:
   a photonic crystal, comprising a periodic dielectric structure of at least two different dielectric materials and having a photonic bandgap;
   a gain medium within the periodic dielectric structure, comprising a plurality of atoms providing light emission within the photonic bandgap; and
   a plurality of microcavity defects within the periodic dielectric structure wherein the size, shape, dielectric constant, and spacing of the microcavity defects are selected to tune the photonic density-of-states of the gain medium so as to modify the light emission rate between the atomic levels of the plurality of atoms, wherein at least one of the plurality of microcavity defects comprises an interstitial defect.

2. The optical amplifier of claim 1, wherein the plurality of microcavity defects are spaced less than a critical distance apart to achieve hopping conduction of photons between the plurality of microcavity defects.

3. The optical amplifier of claim 2, wherein the plurality of microcavity defects are arrayed to provide directional photonic output of the light emission.

4. The optical amplifier of claim 1, wherein at least one of the plurality of microcavity defects further comprises a vacancy defect.

5. The optical amplifier of claim 1, wherein the periodic dielectric structure comprises one-dimensional periodicity.

6. The optical amplifier of claim 1, wherein the periodic dielectric structure comprises two-dimensional periodicity.

7. The optical amplifier of claim 1, wherein the periodic dielectric structure comprises three-dimensional periodicity.

8. The optical amplifier of claim 1, wherein the plurality of atoms comprises rare earth atoms.

9. The optical amplifier of claim 8, wherein the plurality of atoms comprises erbium, praseodymium, thulium, or ytterbium.

10. The optical amplifier of claim 1, wherein one of the at least two different dielectric materials comprises silicon.

11. The optical amplifier of claim 10, wherein the silicon is doped with the plurality of atoms.

12. An optical amplifier, comprising:
    a photonic crystal, comprising a periodic dielectric structure of at least two different dielectric materials and having a photonic bandgap;
    a gain medium within the periodic dielectric structure, comprising a plurality of atoms providing light emission within the photonic bandgap; and
    a plurality of microcavity defects within the periodic dielectric structure wherein the size, shape, dielectric constant, and spacing of the microcavity defects are selected to tune the photonic density-of-states of the gain medium so as to modify the light emission rate between the atomic levels of the plurality of atoms, wherein at least one of the plurality of microcavity defects comprises a vacancy defect.

13. The optical amplifier of claim 12, wherein at least one of the plurality of microcavity defects further comprises an interstitial defect.

14. The optical amplifier of claim 12, wherein the plurality of microcavity defects are spaced less than a critical distance apart to achieve hopping conduction of photons between the plurality of microcavity defects.

15. The optical amplifier of claim 14, wherein the plurality of microcavity defects are arrayed to provide directional photonic output of the light emission.

16. The optical amplifier of claim 12, wherein the periodic dielectric structure comprises one-dimensional periodicity.

17. The optical amplifier of claim 12, wherein the periodic dielectric structure comprises two-dimensional periodicity.

18. The optical amplifier of claim 12, wherein the periodic dielectric structure comprises three-dimensional periodicity.

19. The optical amplifier of claim 12, wherein the plurality of atoms comprises rare earth atoms.

20. The optical amplifier of claim 19, wherein the plurality of atoms comprises erbium, praseodymium, thulium, or ytterbium.

21. The optical amplifier of claim 12, wherein one of the at least two different dielectric materials comprises silicon.

22. The optical amplifier of claim 21, wherein the silicon is doped with the plurality of atoms.

23. The optical amplifier of claim 12, wherein at least one of the plurality of microcavity defects further comprises a different vacancy defect.

* * * * *